US008283262B2

(12) United States Patent
Brenninger et al.

(10) Patent No.: US 8,283,262 B2
(45) Date of Patent: Oct. 9, 2012

(54) METHOD FOR DEPOSITING A LAYER ON A SEMICONDUCTOR WAFER BY MEANS OF CVD AND CHAMBER FOR CARRYING OUT THE METHOD

(75) Inventors: Georg Brenninger, Oberbergkirchen (DE); Alois Aigner, Marktl (DE)

(73) Assignee: Siltronic AG, Munich (DE)

( * ) Notice: Subject to any disclaimer, the term of this patent is extended or adjusted under 35 U.S.C. 154(b) by 498 days.

(21) Appl. No.: 12/499,924

(22) Filed: Jul. 9, 2009

(65) Prior Publication Data

US 2010/0015402 A1    Jan. 21, 2010

(30) Foreign Application Priority Data

Jul. 16, 2008  (DE) .......................... 10 2008 034 260

(51) Int. Cl.
*H01L 21/00* (2006.01)
(52) U.S. Cl. .......................... 438/758; 118/725; 428/172
(58) Field of Classification Search .................. 438/758; 118/725; 428/172
See application file for complete search history.

(56) References Cited

U.S. PATENT DOCUMENTS

| | | | | |
|---|---|---|---|---|
| 6,091,045 A | * | 7/2000 | Mabuchi et al. .......... 219/121.43 |
| 6,099,648 A | * | 8/2000 | Anderson .................... 118/715 |
| 6,143,079 A | * | 11/2000 | Halpin ........................ 118/715 |
| 6,325,858 B1 | | 12/2001 | Wengert et al. |
| 6,406,543 B1 | | 6/2002 | Anderson |
| 6,436,837 B1 | | 8/2002 | Anderson |
| 6,454,863 B1 | * | 9/2002 | Halpin ........................ 118/725 |
| 6,869,485 B2 | * | 3/2005 | Halpin ........................ 118/725 |
| 6,872,438 B1 | * | 3/2005 | Allgeuer et al. ................. 428/92 |
| 2002/0020358 A1 | * | 2/2002 | Hey et al. ...................... 118/725 |
| 2002/0185062 A1 | * | 12/2002 | Halpin ........................ 118/50.1 |
| 2004/0028810 A1 | | 2/2004 | Grant et al. |
| 2006/0291832 A1 | | 12/2006 | Ito |
| 2007/0281084 A1 | | 12/2007 | Hirosawa et al. |
| 2010/0015402 A1 | * | 1/2010 | Brenninger et al. .......... 428/172 |

FOREIGN PATENT DOCUMENTS

| | | |
|---|---|---|
| DE | 102008034260 A1 * | 1/2010 |
| EP | 0728850 A2 | 8/1996 |
| JP | 3022411 A | 1/1991 |

(Continued)

*Primary Examiner* — Laura Menz
(74) *Attorney, Agent, or Firm* — Leydig, Voit & Mayer, Ltd.

(57) ABSTRACT

A method for depositing a layer on a semiconductor wafer using chemical vapor deposition (CVD). The method includes providing a chamber having an inlet opening and an outlet opening and a channel joining the inlet opening and the outlet opening, wherein the channel is bounded at the bottom by a plane and at the top by a window transmissive to thermal radiation. A semiconductor wafer is disposed so that a surface of the semiconductor lies in the plane, wherein the window has a center region disposed over the semiconductor wafer and an edge region surrounding the center region and not disposed over the semiconductor wafer. A distance between the plane and the window varies across the chamber, the distance being greater at the edge region than at the center region. A tangent applied to a radial profile of the distance at a boundary between the center region and the edge region forms an angle with the plane of not less than 15° and not more than 25°. A deposition gas is conducted through the channel from the gas inlet opening over the semiconductor wafer to the gas outlet opening, wherein a speed at which the deposition gas is conducted varies over the semiconductor wafer according to the varying distance between the plane and the window.

4 Claims, 3 Drawing Sheets

FOREIGN PATENT DOCUMENTS

| | | |
|---|---|---|
| JP | 11240794 A | 9/1999 |
| JP | 2001512901 A | 8/2001 |
| JP | 2002521817 A | 7/2002 |
| JP | 2004091848 A | 3/2004 |
| JP | 2004-207545 A | 7/2004 |
| JP | 2006186271 A | 7/2006 |
| JP | 2007012664 A | 1/2007 |
| JP | 2007324286 A | 12/2007 |
| JP | 2009147105 A | 7/2009 |
| JP | 2010062535 A * | 3/2010 |
| KR | 20060114657 A | 11/2006 |
| WO | WO 9907925 A1 | 2/1999 |

* cited by examiner

METHOD FOR DEPOSITING A LAYER ON A SEMICONDUCTOR WAFER BY MEANS OF CVD AND CHAMBER FOR CARRYING OUT THE METHOD

CROSS REFERENCE TO PRIOR APPLICATIONS

Priority is claimed to German Patent Application No. DE 10 2008 034 260.2, filed Jul. 16, 2008. The entire disclosure of said application is incorporated by reference herein.

The present invention relates to a method for depositing a layer on a semiconductor wafer by means of CVD ("chemical vapor deposition") in a chamber, comprising conducting a deposition gas from a gas inlet opening of the chamber over the semiconductor wafer to a gas outlet opening of the chamber, wherein the deposition gas is conducted through a channel bounded at the top by a window that is transmissive to thermal radiation.

BACKGROUND

The typical construction of a chamber for depositing a layer on a semiconductor wafer by means of CVD is described, for example, in U.S. Pat. No. 6,325,858 B1. The chamber is divided into an upper half and into a lower half. The upper half is closed off by a cover, also called an upper dome. The cover comprises a base which forms the side wall of the cover and a window composed of quartz that is transparent to thermal radiation. The base is on a side wall of the chamber which is provided with a gas inlet opening and a gas outlet opening arranged opposite the latter. Situated between the upper half and the lower half of the chamber is a susceptor that receives the semiconductor wafer to be coated. The susceptor is held by a rack with spider-type arms and can be raised, lowered and rotated with the aid of the rack. The lower half of the chamber is closed off by a baseplate similar to the cover, said baseplate likewise being transparent to thermal radiation. Lamps arranged above the cover and below the base plate are activated in order to deposit a layer on a semiconductor wafer placed into the chamber. The deposition gas is conducted through the gas inlet opening to the gas outlet opening and over the semiconductor wafer on this path. In this case, it flows through a channel bounded by the window at the top.

One of the challenges when depositing a layer on a semiconductor wafer by means of CVD is the requirement that the deposited layer is intended to have a layer thickness that is as uniform as possible. One measure of assessing the variation of the layer thickness is the range, defined as the difference between the maximum thickness $t_{max}$ and the minimum thickness $t_{min}$ of the layer. The parameter R derived therefrom describes the ratio of half of this difference and the mean thickness $t_m$ in percent and is calculated according to the formula $R=100\%*(t_{max}-t_{min})/2*t_m$. Accordingly, the layer thickness is all the more uniform, the smaller the value of R.

US 2002/0020358 A1 describes improving the uniformity of the thickness of a layer deposited by means of CVD. The method described therein comprises producing a particular reaction zone ("prewafer reaction layer") that combats an excessive layer growth in the edge region of the semiconductor wafer, which is known as the "edge effect".

SUMMARY

An aspect of the present invention was to specify a possibility that can be realized more simply for improving the uniformity of the thickness of a layer deposited on a semiconductor wafer by means of CVD.

In an embodiment, the present invention provides for a method for depositing a layer on a semiconductor wafer using chemical vapor deposition (CVD). The method includes providing a chamber having an inlet opening and an outlet opening and a channel joining the inlet opening and the outlet opening, wherein the channel is bounded at the bottom by a plane and at the top by a window transmissive to thermal radiation. A semiconductor wafer is disposed so that a surface of the semiconductor lies in the plane, wherein the window has a center region disposed over the semiconductor wafer and an edge region surrounding the center region and not disposed over the semiconductor wafer. A distance between the plane and the window varies across the chamber, the distance being greater at the edge region than at the center region. A tangent applied to a radial profile of the distance at a boundary between the center region and the edge region forms an angle with the plane of not less than 15° and not more than 25°. A deposition gas is conducted through the channel from the gas inlet opening over the semiconductor wafer to the gas outlet opening, wherein a speed at which the deposition gas is conducted varies over the semiconductor wafer according to the varying distance between the plane and the window.

BRIEF DESCRIPTION OF THE DRAWINGS

The present invention is described in greater detail below on the basis of embodiments and of the drawings in which.

DETAILED DESCRIPTION

The inventors have discovered that the radial profile of the distance between the plane in which the surface of the semiconductor wafer to be coated lies and the window arranged above the semiconductor wafer can be used to locally influence the deposition rate, that is to say the speed at which the layer is deposited on the semiconductor wafer. The distance between the window and the plane also influences the speed at which the deposition gas flows over the semiconductor wafer. The smaller the distance the higher the speed. The inventors have furthermore discovered that the deposition rate is lower in the case of a larger distance from the plane. Conversely, the deposition rate is higher if the distance from the plane is smaller. On the basis of this insight, the inventors have discovered, finally, how the radial profile of the distance from the plane should be configured in order to be able to coat semiconductor wafers by means of CVD so that the variation of the thickness of the deposited layer is particularly small. In this case, they have also taken account of the fact that with the distance remaining constant, it is observed that the deposition rate is lower in the center of the semiconductor wafer than at the edge of the semiconductor wafer.

The present invention also relates to a chamber for depositing a layer on a semiconductor wafer by means of CVD, comprising a gas inlet opening for leading a deposition gas into the chamber, a gas outlet opening for conducting away the deposition gas from the chamber, a susceptor for receiving a semiconductor wafer to be coated, and a window that is transmissive to thermal radiation and is arranged opposite the susceptor, wherein the distance between a plane in which the surface of the semiconductor wafer to be coated lies and the window is larger in a center region of the window and in an edge region of the window on the outside than on the inside, and a tangent applied to the radial profile of the distance at the boundary between the center region and the edge region forms with the plane an angle of not less than 15° and not more than 25°, wherein the center region of the window is an inner region of the window that covers the semiconductor wafer, and the edge region of the window is an outer region of the window that does not cover the semiconductor wafer.

Figure 1:
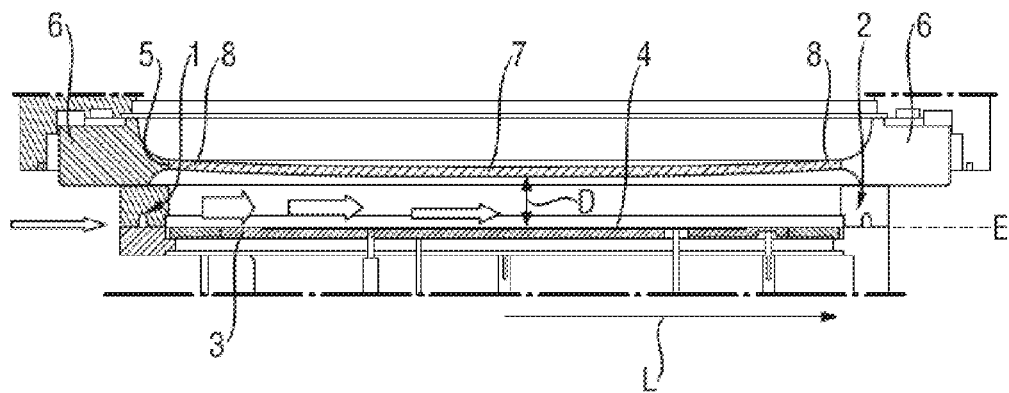
FIG. 1 shows the features of a chamber configured according to the present invention in cross section.

The chamber in accordance with FIG. 1 comprises a side wall with a gas inlet opening 1 for feeding a deposition gas into the chamber, and a gas outlet opening 2 for conducting away the deposition gas from the chamber, a susceptor 3 for receiving a semiconductor wafer 4 to be coated, and a window 5 arranged opposite the susceptor. The window 5 is connected to a base 6, which lies on the side wall of the chamber. It is transmissive to thermal radiation and is composed, for example, of quartz. The surface of the semiconductor wafer to be coated defines a plane E that is at a specific distance D from the window 5. The distance D lies, for example, in a range of 25-35 mm. The lower area of the base lies parallel to the plane E. The partial area of the window which covers the semiconductor wafer to be coated is referred to hereinafter as the center region 7 of the window. Its radius corresponds to the radius of the semiconductor wafer. The outer area of the window adjoining the center region is referred to hereinafter as the edge region 8 of the window. The ratio of the width of the center region and the width of the edge region of the window typically lies in the range of 1.5 to 2.5.

The speed at which a deposition gas is conducted over the semiconductor wafer is not constant, since the distance between the window and the plane in which the surface of the semiconductor wafer to be coated lies changes. The radial profile of the distance is configured in such a way that the distance decreases from the edge region of the window toward the center region of the window. The magnitude of the speed is symbolized by the length of arrows in FIG. 1.

Figure 2:
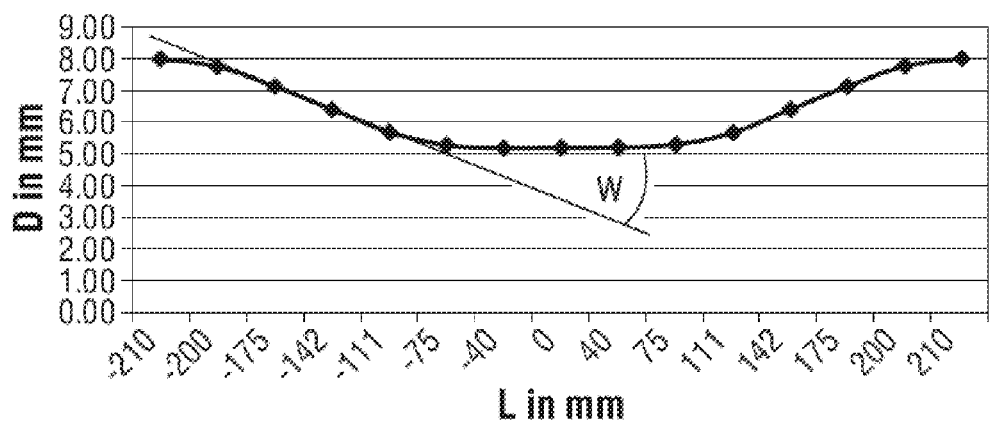
FIG. 2 shows the radial profile of the distance D between the window and the plane E using the example of a window embodied according to the present invention.

FIG. 2 shows the distance D between the window and the plane E using the example of a window embodied according to the present invention as a function of the distance L from the center of the window, and hence the radial profile of the distance D. This profile is characterized by the fact that at the location at which the center region of the window adjoins the edge region of the window, a tangent applied to the radial profile of the distance D forms with the plane E an angle which is not less than 15° and not more than 25°.

Configurations of the window are those, for example, in which the distance decreases as follows as viewed from the outside to the inside: in the center region of the window in such a way that the difference $D_{max}-D_{min}$ between the maximum and the minimum distance of the window from the plane is not less than 0.5 mm and not more than 2 mm, and in the edge region of the window in such a way that the difference $D_{max}-D_{min}$ between the maximum and the minimum distance of the window from the plane in the center region of the window is not less than 0.5 mm and not more than 2 mm.

Owing to the smaller width of the edge region of the window relative to the width of the center region of the window, the change in the distance is larger in the edge region of the window than in the center region of the window. The distance does not have to decrease continuously as viewed from the outside to the inside. It can also remain constant in particular in an inner section of the center region, as shown by the radial profile in accordance with FIG. 2.

EXAMPLE/COMPARATIVE EXAMPLE

Figure 3:
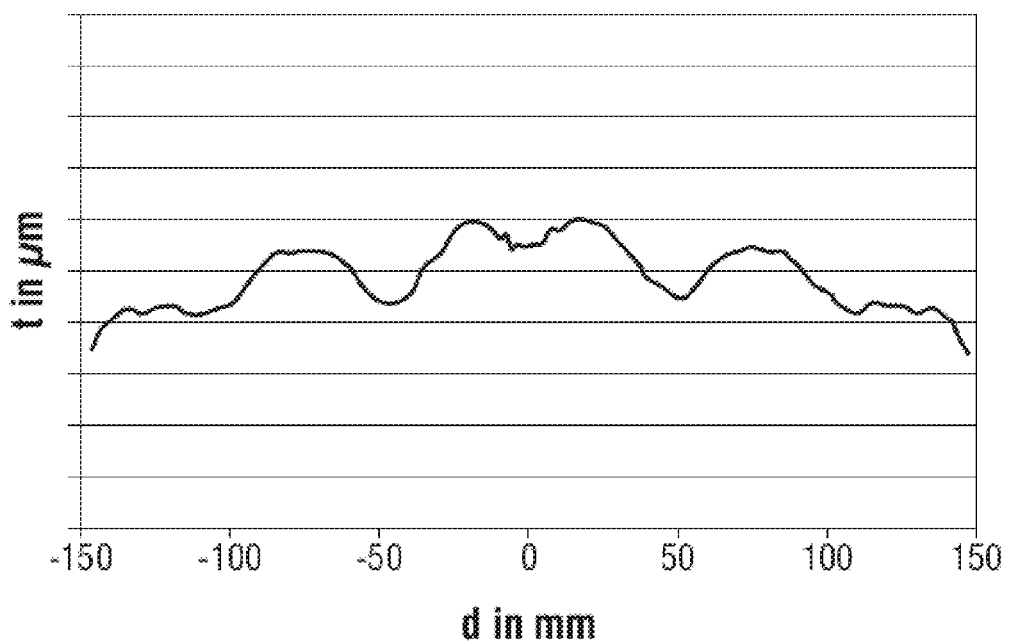
FIGS. 3 to 5 show the radial profile of the layer thickness of semiconductor wafers that were coated with and without the use of the present invention, taking account of an edge exclusion of 3 mm.

An epitaxial layer composed of silicon was in each case deposited on semiconductor wafers composed of silicon having a diameter of 300 mm. The way in which the embodiment of the window affects the radial profile of the thickness of a layer deposited on the semiconductor wafers was tested. Only the window wherein the radial profile of the distance D from the plane E corresponded to the illustration in FIG. 2 was embodied according to the present invention. A semiconductor wafer that was coated in a chamber comprising this window received a layer whose thickness profile is shown in FIG. 3 (example).

Figure 4:
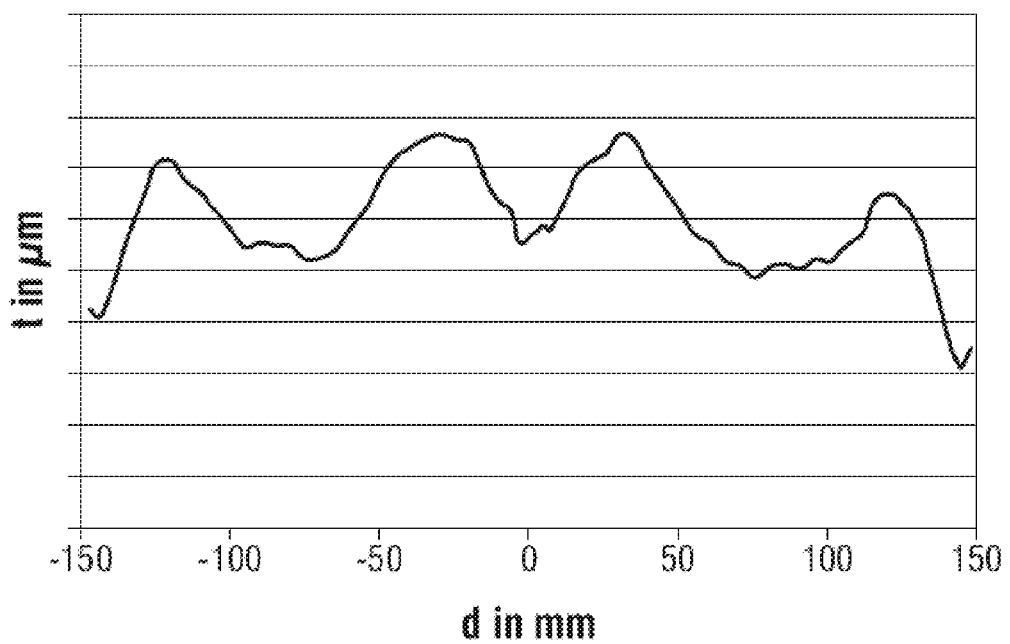

The window that was used for coating the semiconductor wafer whose layer thickness profile is illustrated in FIG. 4 (comparative example 1) had the following properties: the radial profile of the distance D of the window from the plane E was configured in such a way that the tangent that was applied to the boundary between the center region and the edge region formed with the plane E at an angle of 9.2°. In the center region, the window was configured in such a way that the difference $D_{max}-D_{min}$ between the maximum and the minimum distance of the window from the plane E had the value 2.3 mm. In the edge region, the window was configured in such a way that the difference $D_{max}-D_{min}$ between the maximum and the minimum distance of the window from the plane E had the value 2.9 mm.

Figure 5:
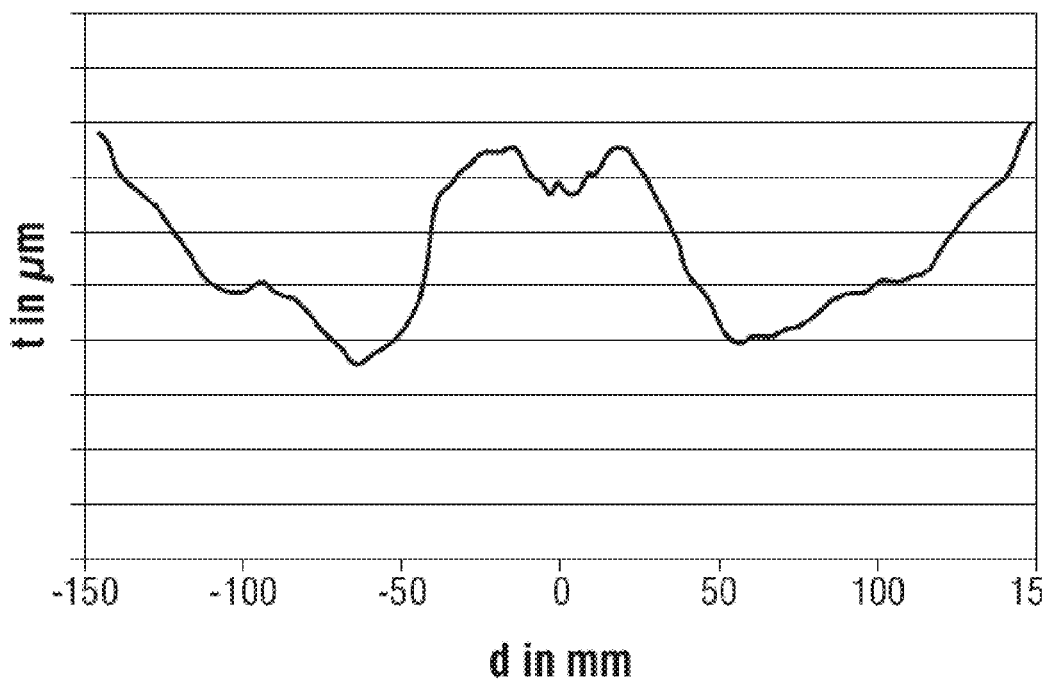

The window that was used for coating the semiconductor wafer whose layer thickness profile is illustrated in FIG. 5 (comparative example 2) had the following properties: the radial profile of the distance D of the window from the plane E was configured in such a way that the tangent that was applied to the boundary between the center region and the edge region formed with the plane E at an angle of 32.5°. In the center region, the window was configured in such a way that the difference $D_{max}-D_{min}$ between the maximum and the minimum distance of the window from the plane E had the value 0.3 mm. In the edge region, the window was configured in such a way that the difference $D_{max}-D_{min}$ between the maximum and the minimum distance of the window from the plane E had the value 2.2 mm.

As shown by the comparison of the layer thickness profiles, the thickness t of the deposited layer in the profile of the diameter d fluctuated to a considerably lesser extent in the case of the semiconductor wafer coated according to the present invention and in the case of the comparative examples. What is particularly noticeable about the comparative examples, moreover, is the layer thickness that decreases significantly on the outside (comparative example 1) and the layer thickness that increases significantly on the outside (comparative example 2). In order to quantify the variation of the thickness of the deposited layers, the parameter R described in the introduction was determined, wherein the arithmetic mean of the layer thicknesses that were measured at 96 distributed positions taking account of the edge exclusion of 3 mm was used as the mean layer thickness $t_m$. The result is summarized in the following table:

TABLE

|  | Example | Comparative Example 1 | Comparative Example 2 |
|---|---|---|---|
| R | 0.48% | 0.82% | 0.80% |

The present application is not limited to embodiments described herein; reference should be had to the appended claims.

What is claimed is:

1. A method for depositing a layer on a semiconductor wafer using chemical vapor deposition (CVD), the method comprising:

providing a chamber having an inlet opening and an outlet opening and a channel joining the inlet opening and the outlet opening, wherein the channel is bounded at the bottom by a plane and at the top by a window transmissive to thermal radiation, disposing a semiconductor wafer so that a surface of the semiconductor lies in the plane, wherein the window has a center region covering the semiconductor wafer and an edge region disposed outside the center region and not covering the semiconductor wafer, wherein a distance between the plane and the window varies across the chamber, the distance being greater at the edge region than at the center region, and wherein a tangent applied to a radial profile of the distance at a boundary between the center region and the edge region forms an angle with the plane of not less than 15° and not more than 25°; and conducting a deposition gas through the channel from the gas inlet opening over the semiconductor wafer to the gas outlet opening, wherein a speed at which the deposition gas is conducted varies over the semiconductor wafer according to the varying distance between the plane and the window.

2. The method as recited in claim 1, wherein the distance between the window and the plane varies across the center region of the window between a maximum center distance and a minimum center distance, and wherein a difference between the maximum center distance and the minimum center distance is not less than 0.5 mm and not more than 2 mm.

3. The method as recited in claim 1, wherein the distance between the window and the plane varies across the edge region of the window between a maximum edge distance and a minimum edge distance, and wherein a difference between the maximum edge distance and the minimum edge distance is not less than 0.5 mm and not more than 2 mm.

4. The method as recited in claim 1, wherein the distance varies from 25-35 mm.

* * * * *